United States Patent
Cedar et al.

(10) Patent No.: US 8,297,271 B2
(45) Date of Patent: Oct. 30, 2012

(54) PORTABLE COMBUSTION DEVICE UTILIZING THERMOELECTRICAL GENERATION

(75) Inventors: Jonathan M. Cedar, Scarsdale, NY (US); Alexander H. Drummond, Austin, TX (US)

(73) Assignee: Biolite LLC, Charlottesville, VA (US)

( * ) Notice: Subject to any disclaimer, the term of this patent is extended or adjusted under 35 U.S.C. 154(b) by 591 days.

(21) Appl. No.: 12/574,647

(22) Filed: Oct. 6, 2009

(65) Prior Publication Data

US 2010/0083946 A1 Apr. 8, 2010

Related U.S. Application Data

(60) Provisional application No. 61/103,335, filed on Oct. 7, 2008.

(51) Int. Cl.
*F24B 1/18* (2006.01)
*F24B 13/00* (2006.01)

(52) U.S. Cl. .......... 126/25 B; 126/15 A; 126/25 R; 126/9 R; 126/501; 110/1 F

(58) Field of Classification Search .......... 126/25 B, 126/25 A, 9 R, 15 A, 501; 110/1 F
See application file for complete search history.

(56) References Cited

U.S. PATENT DOCUMENTS

| | | | |
|---|---|---|---|
| 2,519,241 A | 8/1950 | Findley | |
| 3,279,452 A | 10/1966 | Hottenroth et al. | |
| 3,868,943 A * | 3/1975 | Hottenroth et al. | 126/25 R |

(Continued)

FOREIGN PATENT DOCUMENTS

WO  WO 2006103613 A2  10/2006

OTHER PUBLICATIONS

Lertsatitthanakorn, "Study on the Electrical Performance of Combing Biomass-Fried Cookstove Thermoelectric (Bite) Generator", "Journal of Research in Engineering and Technology", Apr. 1, 2004, pp. 110-116, vol. 1, No. 2, Publisher: Kasetsart University, Published in: Thailand.

(Continued)

*Primary Examiner* — Steven B McAllister
*Assistant Examiner* — Nikhil Mashruwala
(74) *Attorney, Agent, or Firm* — William A. Loginov; Loginov & Associates, PLLC

(57) ABSTRACT

This invention provides a portable combustion device that provides a cleaner combustion, reduces the kindling period, and provides a more efficient overall combustion through the use of a fan that directs a predetermined volume of airflow over the combustible fuel—typically wood or similar cellulose-based biological solids. The combustion device has a combustion chamber into which the fuel source is placed for combustion. Mounted to the side of the combustion chamber is a housing that encloses the TEG, which generates an electrical output based on a difference in temperature on opposing sides. Mounted onto the TEG housing and protruding into the combustion chamber through a small passageway is a heat-conducting probe and heat-conducting probe base unit. The opposing side of the TEG is also in contact with a heat sink to remove heat from the TEG device through interaction with ambient air that passes over the vanes from a port located along the side of the TEG housing. A motor and fan near the heat sink to draw air away the heat sink and aid in the cooling of the heat sink, and force air onto the combusting fuel through a plurality of peripheral ports that connect with an air space located between the inner and outer walls of the combustion chamber.

13 Claims, 12 Drawing Sheets

U.S. PATENT DOCUMENTS

| | | | |
|---|---|---|---|
| 4,545,360 | A | 10/1985 | Smith et al. |
| 4,616,627 | A | 10/1986 | Haygood |
| 4,773,847 | A | 9/1988 | Shukla et al. |
| 5,024,208 | A | 6/1991 | Hottenroth et al. |
| 5,168,860 | A | 12/1992 | Kibourian |
| 5,516,381 | A | 5/1996 | Kawai et al. |
| 6,095,767 | A | 8/2000 | Caughey |
| 6,588,419 | B1 | 7/2003 | Buezis et al. |
| 6,611,117 | B1 | 8/2003 | Hardt |
| 7,168,363 | B1 | 1/2007 | Brown |
| 2005/0037303 | A1 | 2/2005 | Bachinski et al. |
| 2007/0221205 | A1 | 9/2007 | Landon |
| 2009/0165769 | A1* | 7/2009 | Van Der Sluis ............. 126/15 A |
| 2012/0060819 | A1* | 3/2012 | Hunt et al. .................... 126/1 R |

OTHER PUBLICATIONS

Juanico, et al., "Comparative Analysis of Photovoltaic and Thermoelectric Panels for Powering Isolated Homes", "Journal of Renewable and Sustainable Energy", No. 1-6, Publisher: American Institute of Physics, Published in Argentina.

Mastbergen, "Development and Optimization of a Stove-Powered Thermoelectric Generator"Publisher: Colorado State University, Published in: US.

* cited by examiner

PORTABLE COMBUSTION DEVICE UTILIZING THERMOELECTRICAL GENERATION

RELATED APPLICATION

This application claims the benefit of U.S. Provisional Application Ser. No. 61/103,335, entitled PORTABLE COMBUSTION DEVICE UTILIZING THERMOELECTRICAL GENERATION, by Jonathan Cedar and Alexander H. Drummond, filed Oct. 7, 2008, the teachings of which are expressly incorporated herein by reference.

FIELD OF THE INVENTION

The present invention relates generally to combustion devices, such as fixed and portable cooking stoves, and more particularly to combustion arrangements that provide more efficient use of combustible materials and the energy generated therefrom.

BACKGROUND OF THE INVENTION

There exist a variety of portable combustion devices that may be used, for example, as a stove for cooking or heating, among other uses. In the past, portable combustion devices required a variety of fuels such as those used for liquid fuel stoves, portable and fixed wood stoves and compressed gas fuel stoves. These stoves were used in a variety of different situations such as for camping, emergency or rescue situations, during a power outage or a similar scenario when traditional larger-scale cooking sources (for example gas/electric cooking rages and barbeque grilles) are not available.

While previous devices did provide a combustion device, they all had the similar drawback that they all required a special fuel source. Whether the fuel was kerosene, gasoline, propane or a similar fuel source they all required some canister of fuel to be purchased and carried along with the combustion device. These canisters may be a single use canisters or multi-use canister. However, once the fuel is expended, an additional fuel canister must be supplied to maintain combustion. The availability of fuel poses a serious drawback should the canister run out, especially if used for hiking, or emergency situations. Likely, it is impossible to obtain a new canister of gas or liquid fuel while out camping or during an emergency, and even if it is possible, there is no guarantee that the person would be able to find replacements for their type of fuel and canister. Therefore the operator is required to bring extra canisters of fuel, which adds more weight, and the canisters become yet another accessory that must be carried in additional to device. Moreover, should a person need to use their portable combustion device for an extended length of time, carrying a multitude of canisters for fuel becomes impractical.

Additionally, the canisters of fuel must be disposed of properly after use. Since the canisters are often under pressure and most fuels are harmful or toxic, the canisters can not be left behind at a campsite, or during an emergency scenario. In some cases the canister may not be thrown away like other types of trash, but need to be disposed in a special manner. With a variety of fuels, canister types, and portable combustion devices, which are all made by different companies a person would limited in their options and be forced to continue to use a single fuel source.

Aside from the traditional campfire, there have been several attempts to overcome the disadvantages associated with fuel-burning cooking/heating appliances, one such attempt being a biomass combustion device or biomass stove. A biomass stove is able to burn a variety of biomass fuels such that a person would not be required to supply a compressed liquid fuel source for their portable combustion device. The user could employ whatever fuel is available to achieve the same combustion results as the previous devices. Additionally, the user need not dispose of potentially toxic canisters, and he or she would not be required to carry the appliance's fuel source with him or her. Also, whatever fuel unused, can simply be left behind.

In fact, in many developing countries some form of biomass combustion or biomass stove, burning wood chips, twigs, leaves, peat, etc. (or low-grade coal in some instances) is often used as the primary cooking device for the family meal. Generally the biomass combustion is carried out in some form of simple fire-driven stove, which is used for both heating and cooking However, biomass devices typically have drawbacks that render them undesirable in many situations. For example, biomass stoves are not "clean" burning, that is they produce soot and smoke during the combustion process, which can cover pots, pans, or even food during the combustion. Also, the smoke generated during the combustion process can make the biomass stoves potentially dangerous for indoor use—as the smoke contains large quantities of soot and other toxic combustion products, including carbon monoxide. Nevertheless, such stoves are often used in small indoor spaces with inadequate ventilation in developing countries. In addition, many biomass stoves are heavy, making them less suitable for field use, as they are not easily portable.

One technique for increasing the efficiency of combustion is to provide a driven airflow through the biomass using powered fan, using a variety of motive power sources including, but not limited to, spring and clockwork mechanisms, compressed air/gas and electricity. In the field, the fan is typically driven by a battery or other electrical source. However, batteries may have a short life in use, and/or be discharged (dead), or be in need of recharging, when needed. In addition, batteries are expensive and often unavailable to peoples of developing countries. In addition, batteries are environmentally unfriendly and often disposed of improperly.

Accordingly, it is desirable to provide a portable combustion device that is capable of being used as a stove for cooking and/or heating, which burns commonly available wood and other biomass, and provides similar heat output as other liquid or gas fuels, without the need for batteries or disposable/refillable canisters of fuel. The stove can desirably be easy to carry, low-maintenance and burn fuel without exhausting significant soot, smoke or toxic combustion byproducts. The stove can desirably employ inexpensive and commercially available components and conventional construction techniques in its manufacture.

SUMMARY OF THE INVENTION

This invention overcomes disadvantages of the prior art by providing a portable combustion device that provides a cleaner combustion, reduces the kindling period, and provides a more efficient overall combustion through the use of a fan that directs a predetermined volume of airflow over the combustible fuel—typically wood or similar cellulose-based biological solids. The direction of airflow is accomplished without the need for canister fuels or external power sources using the stove's own generated heat with the aid of a thermoelectric generator (TEG) and novel heat sink arrangement to generate electricity that powers the fan, and drives the airflow.

In an illustrative embodiment, the combustion device has a combustion chamber into which the fuel source is placed for combustion. Mounted to the wall (for example along a side) of the combustion chamber is a housing that encloses the TEG, which generates an electrical output based on a difference in temperature on opposing sides (a "hot side" and a "cold side") of the thermoelectric device, wherein the larger the differential, the larger the electrical output. Mounted onto the TEG housing and protruding into the combustion chamber through a small passageway is a heat-conducting probe and heat-conducting probe base unit. The heat-conducting probe is constructed from a material capable of efficiently transferring the heat generated in the combustion chamber to the heat-conducting probe base, which is in contact with the hot side of the TEG device. On the opposing cold side, the TEG is also in contact with a heat sink having a plurality of independent vanes extending from the base, which is designed to remove heat from the TEG device through interaction with ambient air that passes over the vanes from a port located along the side of the TEG housing. Additionally, the TEG housing has a motor and a airflow driver in the form of a fan (for example an axial centrifugal fan that employs moving blades, vanes or the like to drive air) near the heat sink to further draw air away from the heat sink and/or blow ambient air through the heat sink into the combustion chamber (depending in part upon where the airflow driver(s) is/are located with respect to the heat sink) and aid in the cooling of the heat sink, and to force air onto the combusting fuel through a plurality of peripheral ports that connect with an air space located between the inner and outer walls of the combustion chamber. This arrangement thereby affords the fan-driven airflow the dual purpose of cooling the cold side of the TEG to create a higher heat differential between it and the hot side of the probe and oxidizing the burning fuel, while also insulating the TEG housing from the hot inner walls of the inner flame-contacting part of the combustion chamber.

As the fuel is combusted within the combustion chamber, heat is produced. The heat creates a difference in temperature between the sides of the TEG, thus producing an electrical current output. As the temperature rises, the heat sink cools the device on the opposing side of the TEG creating an even larger temperature differential, and in turn, creating a larger electrical output. This electrical output is transmitted to the motor that is driving the fan, which in turn, draws or blows cooler ambient air across the heat sink thus promoting more efficient, oxygen-rich combustion of the fuel. This cycle essentially creates a feedback loop, which quickly increases the efficiency of the combustion once it begins. This cycle also expedites the kindling cycle, because the heat conducting probe can be placed where the flame is initially lit, thereby allowing airflow to begin when even a low temperature differential is experienced by the TEG.

Moreover, the airflow driver draws or blows outside air into the TEG housing to further cool down the heat sink by drawing cooler outside air across it, as well as drawing the air near the heat sink away from the heat sink. This will cool one side of the TEG device creating a larger temperature differential, which will increase the electrical output to drive motor and fan structure, which will continue to draw more into the TEG housing. Additionally, any surplus electricity from the TEG can be used as part of a cogeneration system to power a charging system for a variety of electrical or electronic devices having appropriate power consumption levels relative to the available heat energy. Such devices can include, for example a radio, light or cellphone charger. Additionally, the airflow driver draws or blows the ambient air from the heat sink and forces the air into the combustion chamber creating more turbulence within the chamber insuring a more efficient combustion. All of these components provide a system that promotes a portable or stationary combustion device which is capable of using biomass fuels that does not require canisters or an external power supply. The invention thereby provides a cleaner burning of biomass fuels, and the use of the TEG device in this configuration ensures a quicker kindling period as well as more efficient combustion. More particularly, the placement of the TEG and its heat-conducting probe, so as to receive optimized heat transfer from the flame and thereby more quickly heat the TEG, ensures quicker operation of the fan/airflow driver, and obviates the need for a startup battery. Additionally, the heat conducting probe defines a conduit for conducting heat from a remote flame or heat source. This discrete heat conduit enables a variety of many flexible design configurations where the TEG and airflow driver can be placed on the outside surface or remotely from (and typically near) any combustion device such as biomass stoves, barbeques, grills, camp fires, butane, alcohol and propane burners, and any other source of open flame and/or heat convection (for example a heated airflow).

In an illustrative embodiment, the combustion device includes a combustion chamber comprising an inner wall defining a combustion space that contains, and is in communication with, a biomass fuel source. There is also provided an outer wall having a side-mounted interface port allowing access to an airspace between the inner wall and the outer wall, the inner wall further comprising a plurality of ports located about the perimeter of the inner wall and providing access to the combustion space. A TEG is located outside the outer wall and including a thermally connected heat-conducting probe on a hot side thereof that extends into the combustion space. The TEG further includes a heat sink thermally connected to a cold side thereof. A motorized airflow driver is electrically connected to the TEG, and is arranged to draw air form an ambient source, over the heat sink and into the interface port so as to generate a positive pressure in the airspace and direct airflow through the plurality of ports and into the combustion space. The inner wall illustratively includes a lower and upper set of peripheral ports that allow the airflow that is driven into the space between the chamber walls to be injected into the interior of the chamber to mix with the burning fuel therein. A deflector is positioned in front of the port in the outer wall to direct the flow of air into a circular pattern, thus creating improved mixture of air and combustion gas, and generating a more-distributed flow within the space. The device includes a set of three legs that elevate the device bottom over a supporting surface. Two of the legs pivotally fold up against the bottom of the device, and a third leg that rotates into and out of engagement with the TEG housing so as to allow it to be released from the combustion chamber when desired. The TEG housing is shaped as a semi-cylinder, sized to be inserted through the top of the combustion chamber for storage therein.

In a further embodiment, the TEG housing can be provided with a predetermined or variable length heat-conducting probe and an extended or differing-shape interface pipe to allow attachment to a variety of combustion devices, such as a barbeque grille or wood burning stove. Appropriate mounting mechanisms can be employed to facilitate mounting of the TEG unit of this universal embodiment to a combustion device.

BRIEF DESCRIPTION OF THE DRAWINGS

The invention description below refers to the accompanying drawings, of which.

DETAILED DESCRIPTION

In accordance with the present invention, there is provided a portable combustion device that generates power and heat by efficiently (i.e. cleanly) burning a biomass fuel. It should be clear that, the term "biomass" can be taken broadly to include any fuel, coal, oil, waste products, etc, that will burn more cleanly and efficiently by injection of air during combustion. Likewise, a further advantage of increased efficiency in the burning of fuel is that less fuel is consumed for a given heat output.

Figure 1:
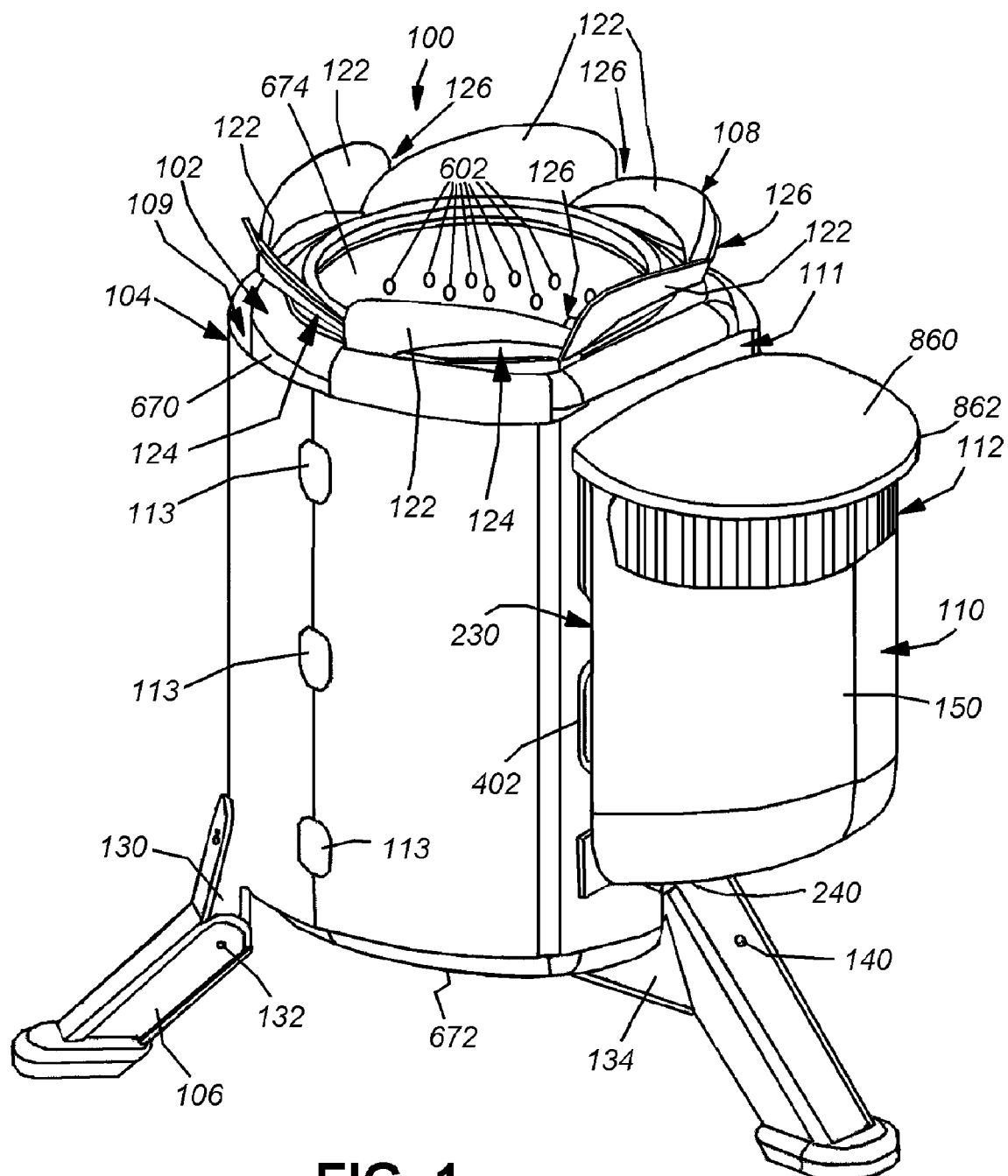
FIG. 1 is a perspective view of a portable combustion device, according to an illustrative embodiment of this invention, showing the combustion chamber and TEG housing fully assembled.
Figure 2:
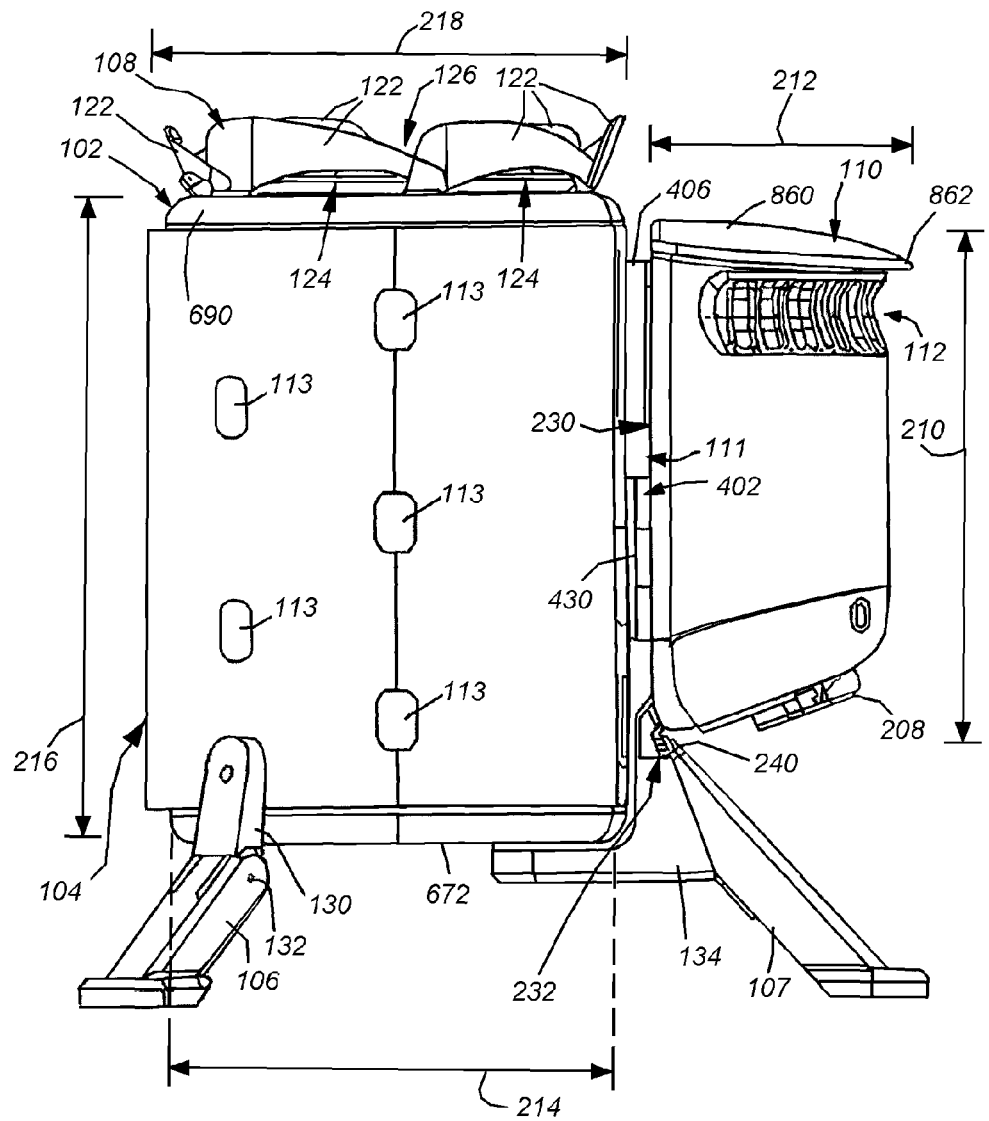
FIG. 2 is side view of the portable combustion device of FIG. 1 according to an illustrative embodiment of this invention.
Figure 3:
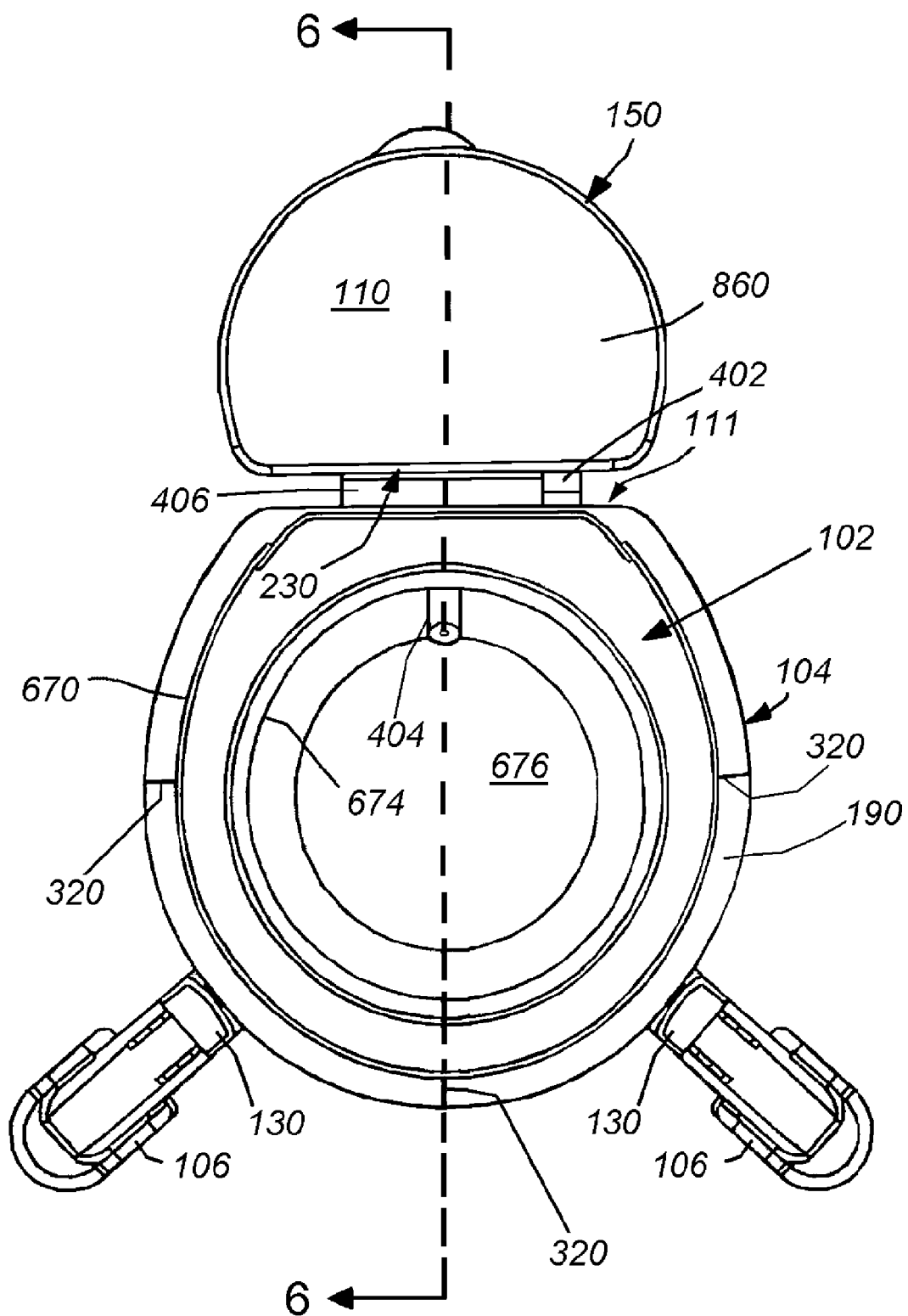
FIG. 3 is a top view of the portable combustion device of FIG. 1 according to an illustrative embodiment of this invention.

FIGS. 1-3 show various views of the portable combustion device 100 according to an illustrative embodiment of this invention. The depicted portable combustion device 100 is relatively cylindrical in shape and is comprised of an internal combustion or burn chamber 102 and a TEG (thermoelectric generator) housing 110 constructed of a durable polymer or lightweight metal, such as an aluminum casting. The combustion chamber 102 is preferably made of a lightweight, durable metal, capable of withstanding the high temperature of combustion with an open flame. The depicted portable combustion device 100 is constructed from steel (e.g. stainless steel sheet having a thickness of $\frac{1}{32}$-$\frac{1}{16}$ inch, variously) and aluminum sheet, with polymeric components where appropriate. However other materials may be used to construct the combustion chamber, such as aluminum, titanium, ceramic, brick, or any other material (or combination of materials) that is durable and capable of with standing high temperatures. Likewise, the shape of the combustion chamber is variable and may be any perimeter and three-dimensional shape, so long as it provides an adequate chamber for combustion of fuels. In this embodiment, it is a cylinder with an inner and outer wall structure providing an airspace therebetween. In alternate embodiments, the combustion chamber can be a more basic enclosure in which the fuel is enclosed to create a flame and allows for injection of air thereinto in accordance with this invention (described below with reference to a "universal" TEG device).

The combustion chamber 102, as depicted, may be disposed within an outer, perforated heat shield 104. The heat shield provides a small barrier to protect against the high temperature within the combustion chamber 102 and is separated from the combustion chamber 102 by an air space 109 that is between approximately $\frac{1}{8}$ and $\frac{1}{4}$ inch in radius in this embodiment. The rear side 111 of the heat shield 104 is flattened to receive the TEG housing 110 and is secured to the combustion chamber by rivets or other fasteners at the rear. The perforations 113 are formed into bent-over stand-offs (320, shown in top view in FIG. 3) attached to one edge of each perforation that maintain the spacing between the heat shield 104 and the combustion chamber 102 without conducting substantial quantities of heat. Alternate spacers can be employed between the heat shield 104 and combustion chamber 102. The illustrative heat shield 104 is constructed from relatively thin-gauge stainless steel as well. However, in an alternate embodiment other durable materials, such as aluminum or a composite, can be employed. Also, while depicted with perforations 113, the heat shield 104 need not be perforated, as it may be a single unitary piece. The heat shield may also, in the alternative, be omitted entirely. In a still further embodiment, the heat shield 104 may be a modular design such that it may be removably secured to the portable combustion device 100.

As shown in FIG. 1, a vertical, pot support or standoff 108 is disposed on a top edge of the combustion chamber 102. The standoff 108 is secured to the top edge by sandwiching between an outer and inner portion of the combustion chamber that are joined at the top. The standoff 108 is formed from a stamped or cut piece of stainless steel sheet. The standoff includes a set of peripheral wings 122 that are shown bent upwardly from a common annular base (see annular base 650 in FIG. 6), which is sandwiched between the inner and outer portions of the combustion chamber. The wings 122 are spot-welded (or otherwise joined together) to form the repeating pattern of curvilinear segments about the perimeter of the combustion device's top end. Notably, the wings 122, when joined together into a somewhat frustoconical, upward-outwardly expanding shape, define lower air vents 124 and upper air vents with respect to the placed of a pot placed thereupon. In general, the standoff 108 provides a level surface for placing an item, such as a pot or pan, to be heated during operation of the portable combustion device 100. Additionally, the standoff 108 is generally constructed to maintain the flame within the combustion chamber 102 directed towards the center of the opening at the top of the combustion chamber 102. This lessens the amount of flame that escapes from the combustion chamber 102 and allows more oxygen to flow to the fire, thereby providing for more efficient combustion. In an illustrative embodiment the standoff 108 is constructed from stainless steel. However, it can be constructed of any material capable of withstanding the high temperatures of combustion supporting a weighted cooking vessel, and formed into the correct shape as required. Such temperatures can be in the range of 1200-1600 degrees F. In another embodiment, the standoff 108 is of a modular design such that it capable of being added or removed with fasteners or clips. Likewise, it can be formed from a unitary casting in other embodiments. In still other embodiments, the standoff can be constructed as a cast or bent wire, having a high temperature resistance without deforming.

Note, as used herein terms such as up, down, vertical, horizontal, radial, axial, and the like are meant to refer to relative directions in view of the depiction of the device 100 with respect to a conventional horizontal supporting surface with a vertical/perpendicularly directed gravitational field acting thereupon. These terms are meant to be conventions only, and not absolute directions, The portable combustion device 100 may also have secured to the heat shield or outermost wall 104 (with screws passing into the outer combustion chamber 102) a plurality of legs 106, 107 to provide a sturdy, stable base for the combustion chamber 102. As described further below, the legs 106, 107 are collapsible on their bases 130, 134, such they provide for easy storage and transportation of the device when not in use. In an illustrative embodiment two legs 106 fold pivotally about transverse pivots 132 (see FIG. 8) beneath the bottom of the combustion device. The rear leg 107, conversely, does not fold under the combustion device, but rather rotates (see double curved arrow 820 in FIG. 8) about a pivot 140, provided between two opposing inclined planed (one on the leg 107 and one on the leg base 134 to an inverted position for convenient storage and transportation. Note that this leg base 134 includes an additional upper support surface 232 on which the TEG housing 110 is supported when attached (refer to FIG. 8 and description below). In the illustrative embodiment, the legs 106 are constructed from a durable plastic polymer. However any materials known in the art such as metals, rubbers, composites, or similarly durable materials can be utilized as well. In an alternate embodiment in which the TEG housing 110 is fully independent of, and remote from the legs, all legs can be adapted to collapse beneath the device and an alternate structure can be used to support and secure the TEG housing 110 in place on the side of the device.

Also shown in FIGS. 1-2 is a slotted ventilation arrangement 112 through which outside air may be drawn during operation of the portable combustion device, as will be described in greater detail below. The slotted ventilation system 112 comprises a series of slots (or any other acceptable porting arrangement) within an upper portion of the outwardly-disposed sidewall 150 of the TEG housing 110. These slots allow air from the ambient environment to be drawn into the TEG housing 110 to promote efficient combustion of the biomass fuel contained within the combustion chamber. The TEG housing, as depicted is essentially a semi-cylinder with a cylindrically curved wall 150 facing outwardly when attached to the combustion chamber 102. The inner wall 230 is flattened to confront the flattened rear wall 111 of the combustion chamber 102.

Reference is now made particularly to FIG. 2, detailing a side view of the portable combustion device 100 of the illustrative invention. As shown, the approximate height 216 of the combustion chamber 102 in an exemplary embodiment in a range of 5-8 inches. The overall diameter 218 of the combustion chamber 102 is in a range of approximately 4-6 inches. Likewise, the exemplary diameter 218 of the heat shield 104 is approximately 4.5-6.5 inches. The TEG housing height 210 is approximately 4-6 inches and the radius 212 of the TEG housing is approximately 2-3 inches. It should be clear that the dimensions provided herein are exemplary of a device of a given device size and that the relative sizes of components can be varied where a larger or smaller combustion device is desired. Likewise, the size and output of the TEG and airflow driver can be varied to suit the particular application. In the case of larger devices, the TEG can be of larger size/output, or multiple TEG units can be used in parallel, or in series. In addition, while the depicted embodiment provides a single combustion chamber 102 for the overall device 100, it is expressly contemplated that the device can include a plurality of individual combustion chambers with respective standoffs for receiving individual cooking implements, etc. In such a multi-burner implementation, each burner can be serviced by an interconnected TEG system that provides forced air throughout the burner group at all times, or by individual TEG units that are independently operated based upon the heat present in that particular burner. Likewise, each burner (in either a single or multiple-burner device) can have more than one TEG unit. This can be, in part dependent on the overall size and capacity of the particular burner. For example, a smaller-scale burner such as combustion chamber 102 may require a single TEG unit, while a larger diameter/volume burner may require multiple TEG units (housings 110) positioned at predetermined locations on the device. In this manner, a single size and shape housing can be used on a variety of device sizes and scales, by changing the number of units mounted thereon.

Figure 8:
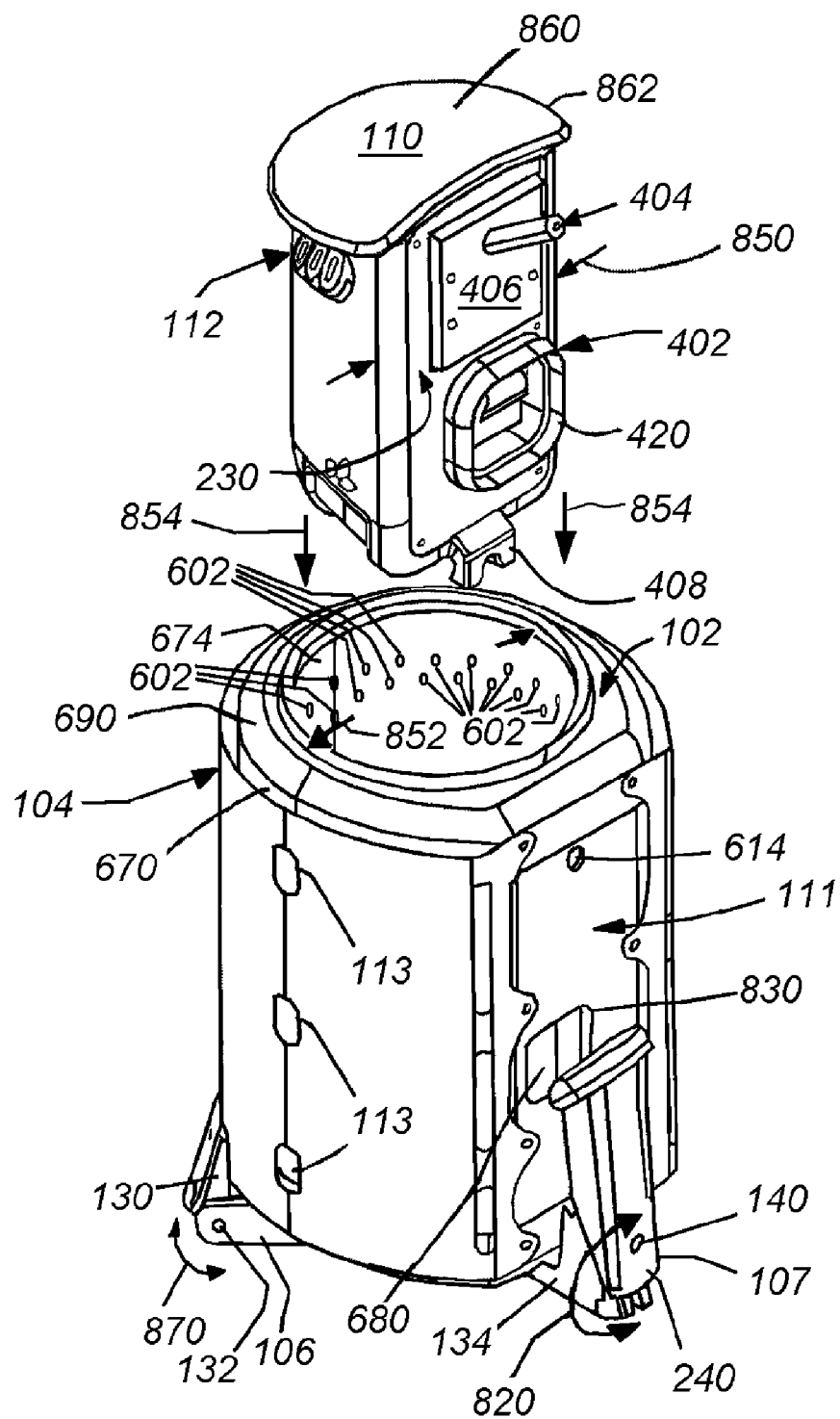
FIG. 8 is an exploded perspective view of the TEG housing, as contained within the combustion chamber showing the disassembly and folding of the device for storage, wherein the legs of the portable combustion device are shown in the collapsed position, and the TEG housing is directed into the body of the device, according to an illustrative embodiment of this invention.

Referring now to FIG. 3, a top view of the portable combustion device 100 of the illustrative embodiment is shown. As depicted, the combustion chamber 102 is disposed within, and surrounded by, a heat shield 104. Also shown, the legs 106 extend outwardly from the portable combustion device so as to provide a sturdy base. The legs are shown in the extended position in FIG. 3, as compared to the collapsed position, as shown in FIG. 8. As will be described in greater detail hereinafter, the heat-conducting probe 404 (shown more clearly in FIG. 4) has a thermally conductive base 406 secured to the TEG housing 110. The heat-conducting probe 404 is in thermal communication with the TEG and provides a probe that extends into the combustion area, protruding through a port in the in walls of the combustion chamber 102. This heat-conducting probe 404, as will be described in greater detail below, allows for greater transmission of heat from the combustion area to the TEG as it intercepts the flames created by the combustion.

Figure 4:
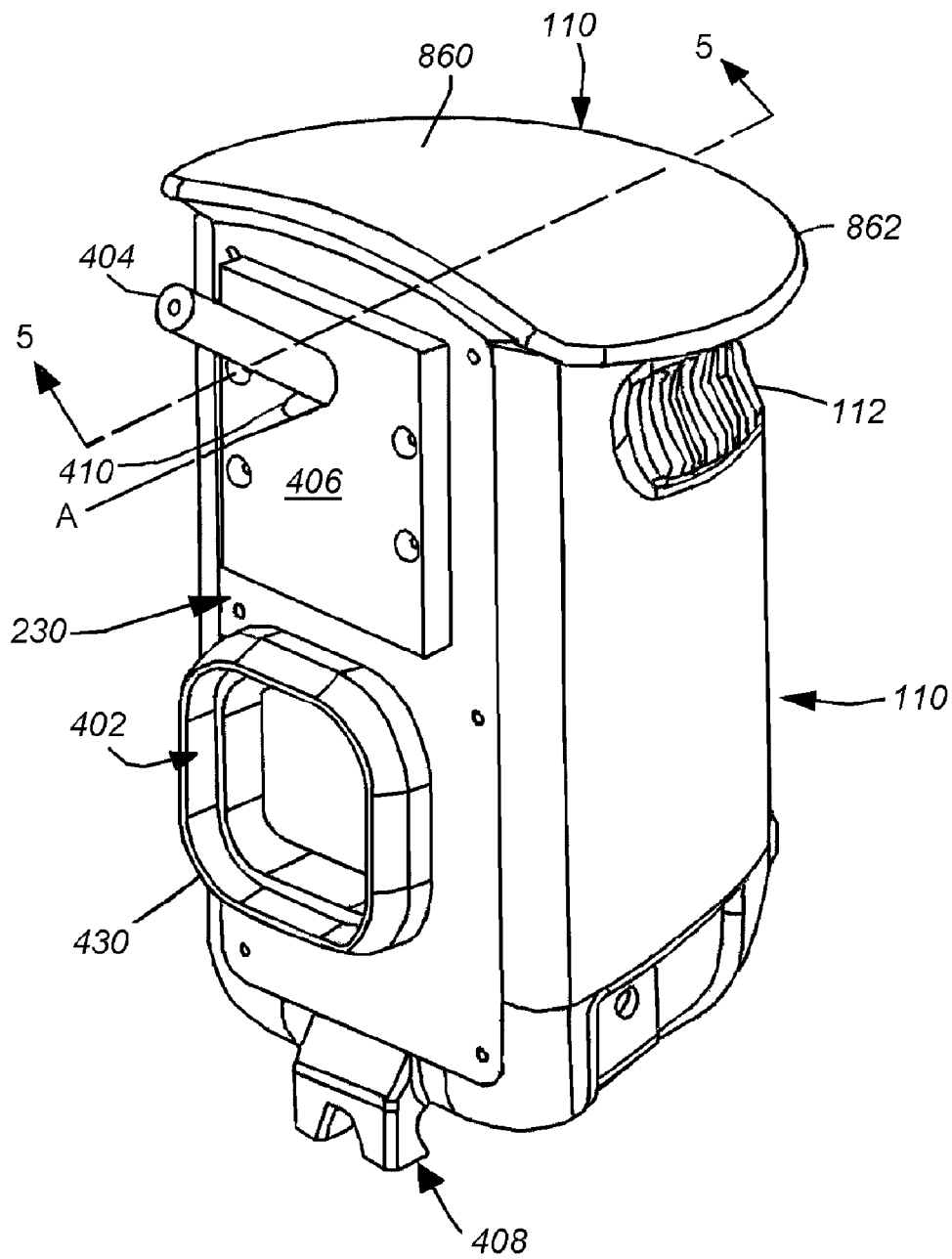
FIG. 4 is a perspective view of the TEG housing according to an illustrative embodiment of this invention.

Referring now also to FIG. 4, a more detailed view of the TEG housing 110 is shown. The TEG housing 110 is removably coupled to the side of the combustion chamber 102 by the upwardly angled heat-conducting probe 404 combined with a support base 408 at the bottom of the TEG housing. The angle A of the heat-conducting probe is approximately 20-40 degrees with respect to the horizontal 410 in this embodiment. The angle is highly variable, but should allow the pipe 404 to be readily passed into and out of conforming holes in the combustion chamber 102. Alternatively, where the TEG unit is permanently or semi-permanently fixed to the exterior of the combustion chamber of a device, the angle of the probe can be steeper that that required to readily pass it into or out of the chamber, although it is expressly contemplated that the angle of the probe in this embodiment and others described herein is widely variable. For example, the angle of the heat conducting probe can be defined so that the probe extends parallel, but attached to, the surface of the hot side heat sink. In alternate embodiments, the TEG unit can be an integral section of the combustion chamber, and can be removed with that section of the chamber itself. Such permanent or semi-permanent fixing can be achieved by forming the TEG housing integrally or unitarily with the associated combustion device or applying it to a wall of the device using fasteners (e.g. rivets or screws) that do not lend themselves to rapid removal by only a few movements and/or without tools.

Figure 6:
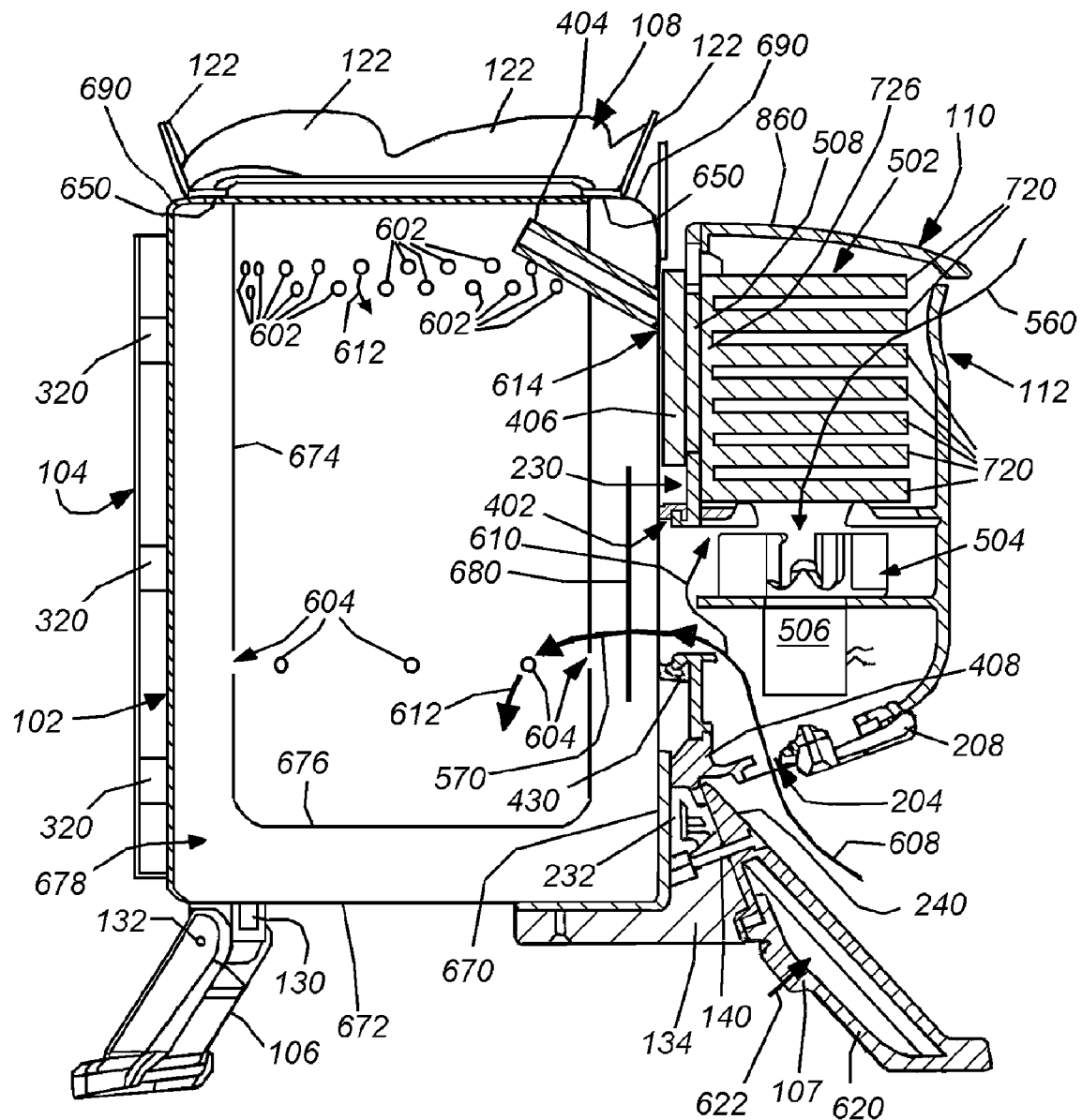
FIG. 6 is a side cross-section of the portable combustion device of FIG. 1 according to an illustrative embodiment of this invention, taken along line 6-6 of FIG. 3.

When the heat-conducting probe 404 is mounted through the holes (see FIGS. 2 and 6), in the combustion chamber, the wall 230 of the TEG housing is brought into a confronting relationship with the rear wall 111 of the combustion chamber and the TEG support base 408 rests upon the support surface 232 of the leg base 134. The upper tip 240 of the leg 107 interferes with removal of the support base 408 with respect to the surface 232. The angled geometry of the heat-conducting probe 404 resists movement of the TEG housing 110 away from the rear wall 111 of the combustion chamber 102 when the tip 240 locks down the base 408. As shown in FIG. 6, the leg 107 includes a live spring lever 620 that can be biased inwardly (arrow 622) to enable the leg to be unlocked with respect to its base 134 and pivot (double curved arrow 820 in FIG. 8) about the bolt/pivot 140 to move the leg's upper tip 240 out of interfering contact with the TEG support base 408. Note that the angled geometry of the probe also allows it to be placed so as to take best advantage of the heat generated during the kindling stage so as to expedite startup of the airflow driver. Likewise, the placement also allows for the good ongoing transmission of heat from the top/cone of the flame after the kindling stage. The length of the probe is highly variable so as to locate it within the hot region of the fire. Alternatively, the heat conducting probe can be positioned at the outlet or rim from where the flame leaves the stove. By way of example, the probe can be shaped as a hook so as to depend from the rim of the stove or fire enclosure, with a portion of the hook projecting into the fire enclosure. In this manner the TEG assembly is removable by unhooking and lifting it away from the rim or other enclosure edge. It is engaged in the reverse fashion—by hooking it to the rim or edge when needed.

Thus, the illustrative TEG housing 110 is a modular design capable of being removably engaged with the combustion chamber 102. As noted generally above, in alternate embodiments, the TEG housing and combustion chamber 102 may be a single integrated device. Alternatively, the TEG housing 110 may be secured to the combustion chamber 102 with clips, fasteners or other devices known in the art for securing objects together. Likewise, the TEG unit (or units) can be located remote from the combustion chamber and device wall, being connected mainly by an appropriately sized heat-conducting probe and an air conduit in communication with the airflow driver so as to deliver a stream of air from a remote location. Such an arrangement is described by way of example with reference to FIG. 9 below.

When the TEG housing 110 is securely locked in place against the wall, the airflow interface 402, which is located in the bottom rear of the TEG along wall 230, is in engagement with an air port formed in the combustion chamber. In an illustrative embodiment, the airflow interface 402 may include a heat-resistant gasket (constructed from silicone, for example) 430 to form a seal between the TEG housing 110 and the combustion chamber 102 in the region of the air port (see port 830 in FIG. 8 with TEG removed). The port 830 is sized and arranged so that the gasket 430 completely surrounds and seals it against leakage. Note, in an alternate embodiment the seal between the TEG and the combustion chamber can be constructed from durable material capable of withstanding elevated temperatures and providing a sufficient seal between two components.

Figure 5:
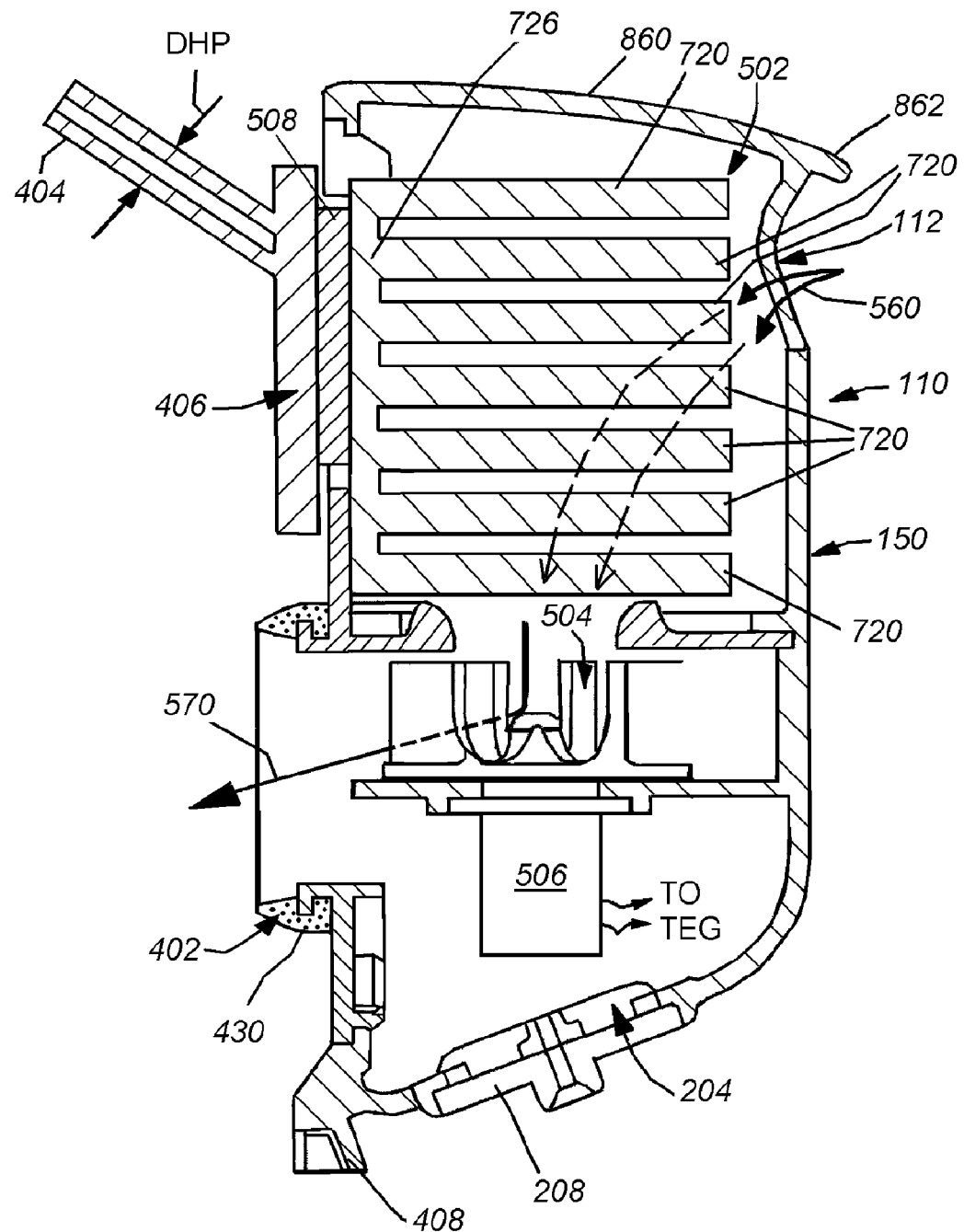
FIG. 5 is a side cross-section of the TEG housing according to an illustrative embodiment of this invention, taken along line 5-5 of FIG. 4.

Referring now to FIG. 5, an illustrative embodiment of the interior of the TEG housing 110 is shown. The heat-conducting probe 404 is secured to the TEG housing 110 at the thermally conductive heat-conducting probe base 406, which is in direct, thermally transmitting contact with the "hot side" of a TEG device 508. The heat-conducting probe 404 can be a hollow tube, having an outer diameter DHP of approximately ⅛-⅜ inches in this embodiment, and can be constructed from any acceptable heat-conducting material, such as steel, copper, graphite or aluminum. While a hollow tube is employed in an illustrative embodiment, the probe can be partially or completely solid in alternate embodiments and can have any cross sectional shape that does not substantially interfere with transmission of heat to the top opening of the chamber 102, and otherwise allows transmission of heat in sufficient level to the hot side of the TEG 508. The heat-conducting probe base 406 can be a cast or milled material that is also any acceptable material, such as steel, aluminum, graphite or copper. The heat conducting probe can be formed to extend at any appropriate angle and shape such as, but not exclusively, an arc or "s" curve. The base 406 is shaped as a rectangular plate in this embodiment, with an exemplary thickness of 1/16-5/16 inch. The heat-conducting probe 404 is attached to the base 406, for example, by brazing or welding. The base 406 is adhered to the TEG 508 by heat-conducting adhesives and/or peripheral fasteners. It should be clear that the make, model and performance specifications of the particular TEG or TEGs (where an array of two or more TEGs is used) employed in an embodiment can vary significantly depending upon power requirements, size and cost, among other factors. In an illustrative embodiment the TEG is constructed and arranged to generate 0.2-2.0 watts and 1.0-3.0 volts at a temperature differential of ±100-200 degrees F. Larger-output TEGs can be employed for cogeneration (described further below), or for use in powering more inefficient motors. One example of an acceptable TEG for the illustrative application is a Mabuchi (Japan) FF-N20PN that draws approximately 0.135 Amps at 1.5 volts. Another exemplary TEG for an illustrative application is available from Marlow Industries, Inc. of Dallas, Tex. as model TG 12-4-01L, having a power output of 0.5-1.0 watts, 1.5-2.0 volts, with a heat differential of approximately 120 degrees Fahrenheit. Yet another example from Laird Technologies of Trenton, N.J. is the model HT4-12-F2-3030-TA W6 having a power output of 1.4 watts, 1.7 volts, with heat differential of approx. 120 degrees F. In other applications, such as cogeneration, a higher output level (for example up to 10 watts can be appropriate). Increased power output can also be achieved by using multiple TEGs as noted above.

In general, the TEG is selected for high-hot-side temperature applications due to its exposure to the flame of the combustion chamber. However, where heat exposure is reduced through insulators, and the like, or by sizing the thermal conductivity of the heat probe, a lower-temperature TEG can be employed. High-temperature TEGs are typically assembled using a high-temperature solder and/or similar attachment mechanism. On the opposing, "cold side" of the TEG device 508 is a heat sink 502. Mounted below the heat sink 502 in the TEG housing 110 is an electrically driven motor 506 of appropriate voltage to be compatible with the TEG. The motor 506 rotates to drive a fan, illustratively shown as a centrifugal impeller 504, in a direct-drive implementation. In an embodiment of the invention, the impeller defines upright, angled fins mounted to a base. In alternate embodiments, any acceptable fan arrangement can be employed including a radially, directed propeller-style blade set joined to a common hub. In general, the terms "airflow driver" and "fan" should be taken broadly to include any acceptable driven, air-moving/driving structure or device. The illustrative embodiment employs a drive motor for the fan that operates from approximately 1.5 volts to 6 volts DC, and has a start-up voltage of $2/10$ volt. Such a motor is generally suitable for operating the airflow driver in a stove of the depicted size and heat capacity. Clearly, the size and power-handling of the motor as well as the size and airflow of the fan are highly variable. In alternate embodiments, the fan and motor can be varied to suit a differing TEG output and/or where multiple TEG/airflow driver assemblies are employed. In an illustrative embodiment the impeller 504 is made of a durable plastic. In alternate embodiments the fan 504 can be made of other materials, such as steel, aluminum or any material known in the art used for making reliable, efficient, and lightweight fan structures.

It is expressly contemplated that the placement of the fan or other airflow-driving mechanism with respect to the TEG and its heat sink is highly variable. In alternate embodiments, the airflow-driver can be positioned upstream of the heat sink to blow air over it. Additionally one or more motors or other driving devices can be arranged to both pull (as shown) and blow airflow with respect to the heat sink. The term "draw" should thus be taken broadly to embody any of these airflow-driving arrangements.

The wiring and circuitry used to connect the TEG and motor have been omitted in the drawing for clarity. The electrical connections and associated control circuitry can be implemented in accordance with well-known electronic principles. In further embodiments, the circuit can include current limiters and other functional components that improve the performance of the system and avoid damage to the motor due to an under-voltage or over-voltage condition. Likewise, it is expressly contemplated that additional circuitry can be provided to facilitate startup at low voltages, during the kindling stage. For example, the wiring can interface with a control circuit that includes a sped control (for example a potentiometer or pulse width modulator) that allows the user to vary the fan speed. This could be beneficial where the user desires to raise or lower the heat output of the fire. The interconnection of the control can be accomplished in accordance with conventional electronic implementations. Likewise, the unit can include an optional small rechargeable or disposable battery and/or storage capacitor that assists in providing initial power to the airflow driver (at the direction of an "on" switch) at the initiation of the kindling stage, before sufficient heat is built up. More generally for power storage is useful in supporting various cogeneration arrangements as described further below by ensuring that the output of power is always sufficient to support the connected device's(s') needs. Whenever, TEG output attains a predetermined output level in excess of draw by the device and/or fan motor, the system's control circuitry engages a charging circuit of conventional design, which replaces the battery's or capacitor's spent energy.

Figure 7:
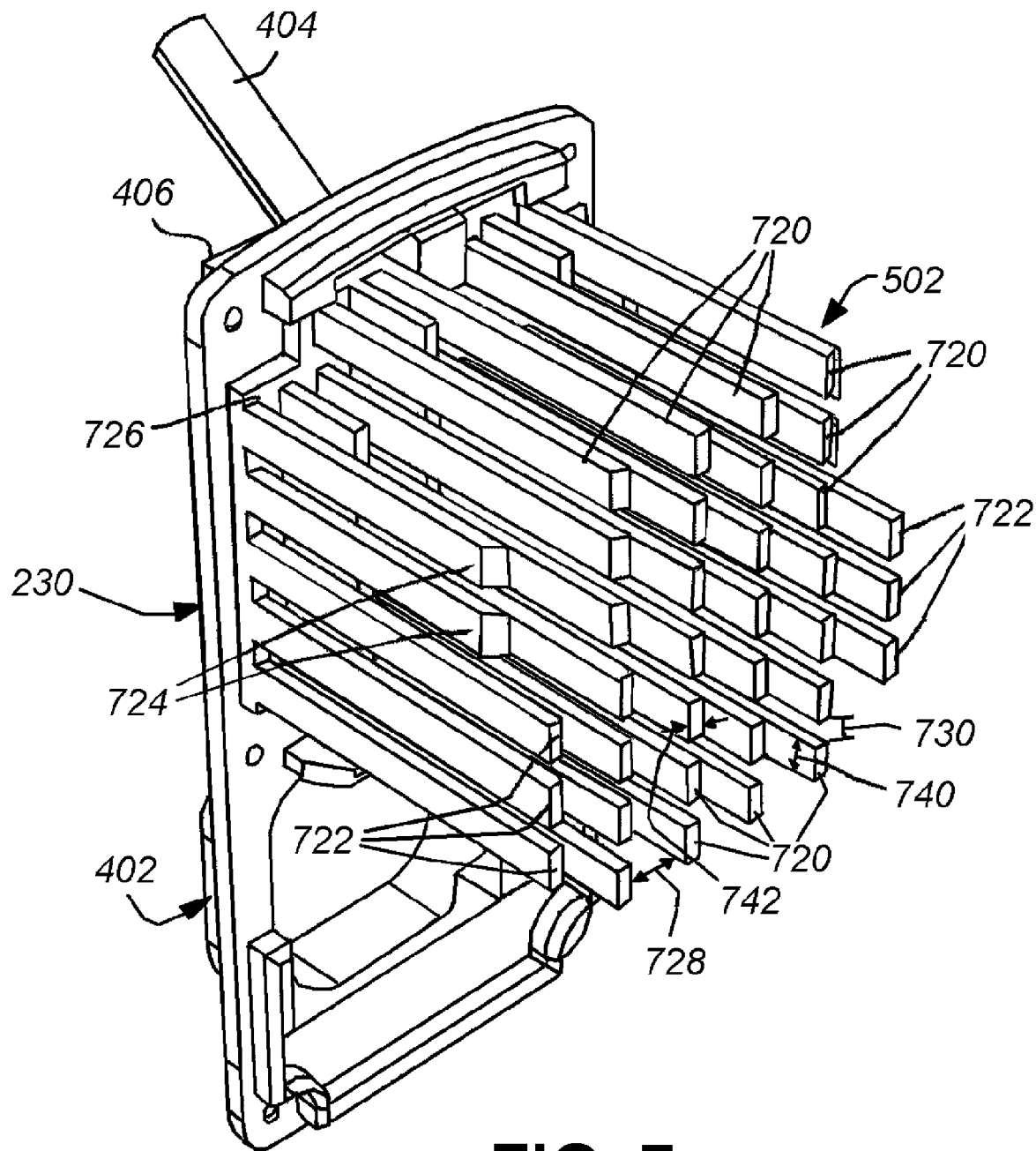
FIG. 7 is a perspective view of the heat sink for use with the TEG according to an illustrative embodiment of this invention.

With reference also to FIG. 7, the flattened wall 230 of the TEG housing 110 is removable from the remaining housing for service and initial assembly. The wall 230 is attached to the remaining housing a variety of techniques including fasteners, such as machine screws or self-tapping screws. As shown, the heat sink 502 comprises a plurality of parallel vanes 720, 722 and 724 that project outwardly from a common planar base 726. The vanes can be sized and shaped in a variety of ways. In this example, they each define a horizontal spacing with respect to each other of approximately ⅛-¼ inch and a vertical spacing 730 of approximately 1/16-⅛ inch. Each vane has a vertical height 740 of between 3/16 and 5/16 inch and a horizontal width of between 1/16 and 3/16 inch. These measurements are exemplary only and the size and shape of the vanes 720, 722 and 724 can be further optimized to the particular airflow characteristic/volume and TEG heat transfer rate. In this embodiment, a plurality of vanes 720 arranged near the center are of the longest length (between approximately 1 and 2 inches from the base 726), while the surrounding vanes 722 and 724 are shortened to accommodate the curve of the TEG housing 110. The heat sink 502 can be constructed from any acceptable thermally-conductive material, such as aluminum, cooper, iron, steel, graphite, and the like, using any acceptable manufacturing technique, such as casting and/or machining The base 726 of the heat sink 502 is mounted in direct thermal contact with the cold side of the TEG 508 using fasteners, adhesives and/or another acceptable technique. It should be clear that the positioning of the heat sink and its vanes in a facing relation with the slots 112 of the housing 110 ensures that the majority of airflow passes over the vanes 720, 722, 724 as it travels downwardly through the impeller 504 and horizontally through the interface 402 into the adjacent combustion chamber port 830. This flow is represented by arrows 560, 570 in FIG. 5.

Figure 6A:
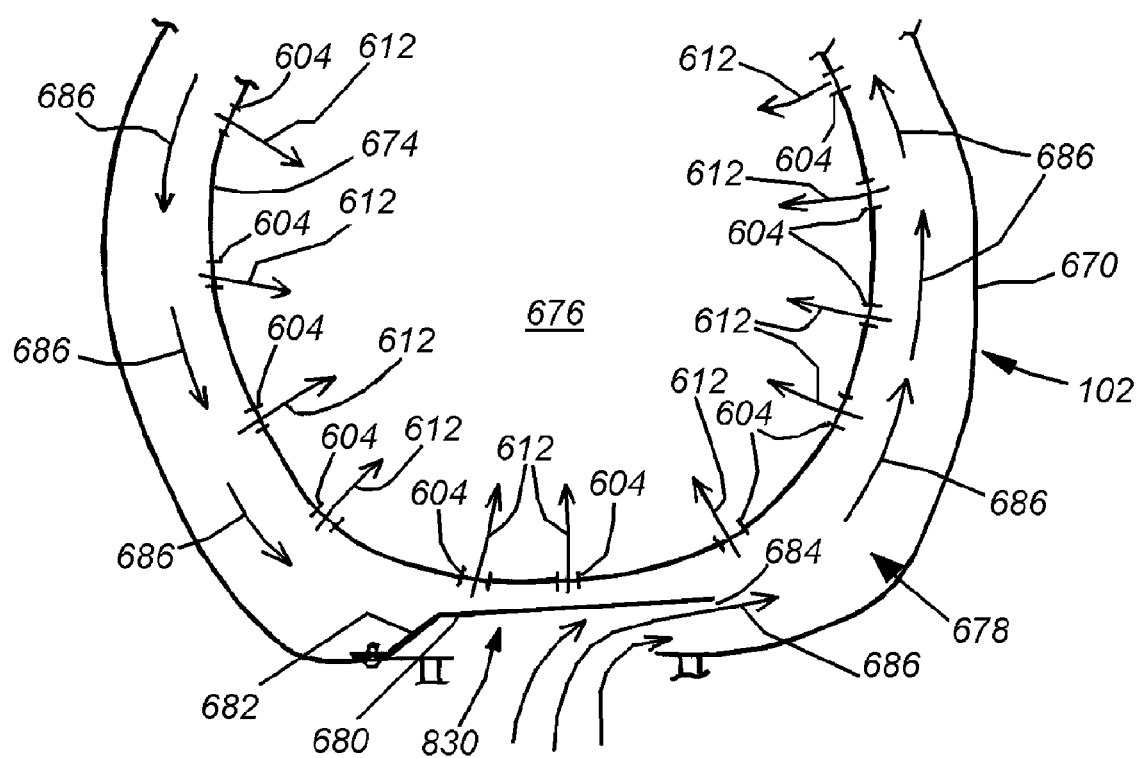
FIG. 6A is a partial top cross section of the combustion chamber illustrating airflow therethrough.

Referring further to FIGS. 6 and 6A, which detail side and partial top cross-sectional views of the portable combustion device 100, the combustion chamber 102 is divided into an outer wall or shell 670 having sides and a bottom 672, and an inner wall 674 also having sides and a bottom 676. Each set of walls 670, 672, 674, 676 defines a "pot" shape with a closed bottom and open top. The inner pot defines a combustion space that receives the biomass fuel (not shown) for burning therein. The walls 670, 647 join at a top annular junction 690. The junction is formed by folding in the outer walls 670 so that they form a receiving orifice that is sized to snugly fit the outer diameter of the inner wall structure 674. As shown, the top joint between the inner and outer walls sandwiches the annular base ring 650 of the standoff 108.

The space 678 between the walls 670, 674 and bottoms 672, 676 receives a positive pressure from the airflow induced by the TEG. The flow is enhanced by a deflector 680 placed in front of the combustion chamber port 830. The deflector 680 is secured to the wall 670 by an angled side base 682 as shown in FIG. 6A, so that airflow does not become concentrated on one part of the inner wall 674, but rather is allowed to escape the open side 684, and thereby circulate (arrows 686) throughout the space 678. This circular flow helps to better distribute the air generated by the impeller and better mix the air and combustion gasses within the combustion space. In addition, the deflector ensures that radiant heat from the combustion chamber is not projected back into the TEG housing. The airflow within the space is distributed into the inner space of the walls 674 and bottom 676 is directed inwardly (arrows 612) at two discrete sets of peripheral ports 602 and 604, located respectively adjacent to the top and the bottom of the inner wall structure 674. In one embodiment, two rows of ⅛ to ¼-inch ports (602) are provided approximately 1-2 inches from the top edge of the combustion chamber 102, and a single row of ⅛-¼-inch of ports (604). The number of air ports, their placement and shape re highly variable. In general, the ports are sized and placed so as to provide an effective mechanism for directing airflow through the enclosed burning fuel without less risk becoming clogged by the fuel or ash debris. In addition, the port placement better ensures overall oxidation of the fuel. It is contemplated, in alternate embodiments, including alternate arrangements of the stove and/or combustion chamber that a single, enlarged port can be employed, or a conduit (air pipe) that directs airflow, via an outlet, to a desired location within the chamber can be employed.

In the illustrative embodiment, the inner walls 674 and bottom 676 are constructed from a unitary-stamped, or built-up/welded-together construction of stainless steel, and the outer walls 670 and bottom 672 are constructed from sheet aluminum that is formed into the illustrated "pot" shape.

In an illustrative embodiment ambient air is drawn through the slotted air vent 112 (arrow 560), and into the TEG housing 110 as shown. The ambient air is used to cool the heat sink 502 and draw heat away from the heat sink 502 to promote a more efficient cooling of the TEG device 508, thereby creating a greater temperature differential with respect to the TEG hot side and interconnected heat-conducting probe 404. When needed, such as in the kindling stage where the fan is stationary or moving slowly, additional outside air (arrow 608) can also be drawn in through the lower air vent 204 in the housing 110. The flow of air through this vent 204 is controlled by a rotating baffle or draft 208. During the kindling stage, when the airflow driver is not yet active, the airflow from the baffle or draft also serve to cool the heat sink 502, as it rises through the housing 110 (shown by arrow 610). Once the fan of the airflow driver is moving actively, the baffle 208 can be closed although this may not be required in alternate embodiments. A baffle or draft could be used to adjust the amount of air entering the burn chamber and generally isolate the airflow circuit from the slots 112 to the airflow interface 402 (and combustion chamber port 830).

Note that, in alternate embodiments, the baffle or draft 208, or vent 204, need not be closable and/or adjustable. It can alternatively define an open draft vent. In this manner, excess pressure from the airflow driver can be exhausted through it. In addition, the vent 204 ca be configured by way of specifically sized and shaped baffles or draft or a venturi—in accordance with accepted aerodynamic principles—to maintain an air flow into the chamber combustion chamber via the lower vent.

It should be clear that the placement of the TEG housing on the outer wall 111 of the outer combustion chamber wall structure 670, combined with the airspace 678 between the inner combustion chamber walls 674 and outer walls 670 helps to ensure that the TEG housing remains relatively thermally isolated, except for the TEG itself through the length of the heat probe. Hence, the interior of the housing is not significantly heated by heat conducted or radiated from other parts of the combustion chamber. In other words, the airflow can be focused on carrying heat away from the TEG via the heat sink. Without the insulating air cushion provided by the airspace 678, the housing would tend to heat up more generally due to conduction and radiation from the burning fuel in the adjacent combustion chamber.

It should also be apparent that the location of the heat-conducting probe 404 provides for the warmest air (typically near the cone of the flame) to be transferred to the heat-conducting probe base 406, thereby efficiently creating the best temperature differential in the TEG. Thus, another advantage of locating the TEG housing 110 on the side of the combustion chamber is the advantageous heat-conducting probe placement that this enables. Likewise, as noted above, this positioning is nearest to the kindling stage of the combustion so as to enable quick and efficient start-up of the TEG unit. The use of the novel heat-conducting probe of the illustrative embodiment also allows for a smaller-output TEG device, thereby reducing unit cost and saving space, as more energy is concentrated at the device during operation. However, in alternate embodiments, the probe and/or airflow outlet can be located at other positions on the combustion chamber that provide other benefits to the combustion device and its operation.

Additionally, as more turbulent air 612 is fed into the interior of the combustion chamber 102 a more efficient combustion will be created, whereby less fuel is required to transfer heat to the TEG device 508. The result is a feedback system where the heat from the combustion, and cooling of the heat sink, powers the fan 504, which further promotes an increased efficiency of the combustion, reducing the fuel and increasing the efficiency of the combustion.

Referring now to FIG. 8, the illustrative embodiment of the combustion device 100 is particularly adapted for compact portability in a pack, bag or other small-volume container. The TEG hosing 110 has an overall diameter 850 at its curved side 150 that is less than or equal to the outer diameter 852 of the inner wall 674 of the combustion chamber 102. Thus, when removed from the side (111) of the combustion device 100, as shown, the TEG housing 110 can be inserted (arrows 854) into the combustion chamber 102, so as to provide a more compact profile. In this embodiment, the top side 860 of the housing 110 includes a lip 862 that extends beyond the diameter 850 to prevent the housing from falling into the chamber, and to allow easy withdrawal of the housing when needed. This lip 862 also helps to prevent accidental spills from entering the TEG housing 110 and potentially clogging or damaging the internals. The remaining space within the inner combustion chamber is available for storage of a small amount of fuel or other items. Note that the legs 106 and 107 have also been folded (double curved arrows 820, 870) about their respective pivots 132, 140 to provide the desired lowered profile for ease of transport. In this folded state, the leg 107 also acts to unlock the TEG housing 110, as described above.

The illustrative embodiment of the present invention, thus, provides a device having a shorter, more-efficient kindling period, as well as substantially more-efficient overall combustion. The use of the conventional biomass-type fuels eliminates the need for purchasing, carrying, and disposing of potentially toxic fuel sources. Additionally, the TEG device 508 eliminates the need for batteries or other external power sources to drive or start the airflow driver that is used to promote the more efficient combustion process. The novel placement and arrangement of airflow-generating and delivery structures also increases the efficiency of the device. The above-described invention generally provides an apparatus and method that is capable of being used in a wide variety of situations, from camping, emergency situations, or used in a developing country as a primary heat and/or cooking source.

Figure 9:
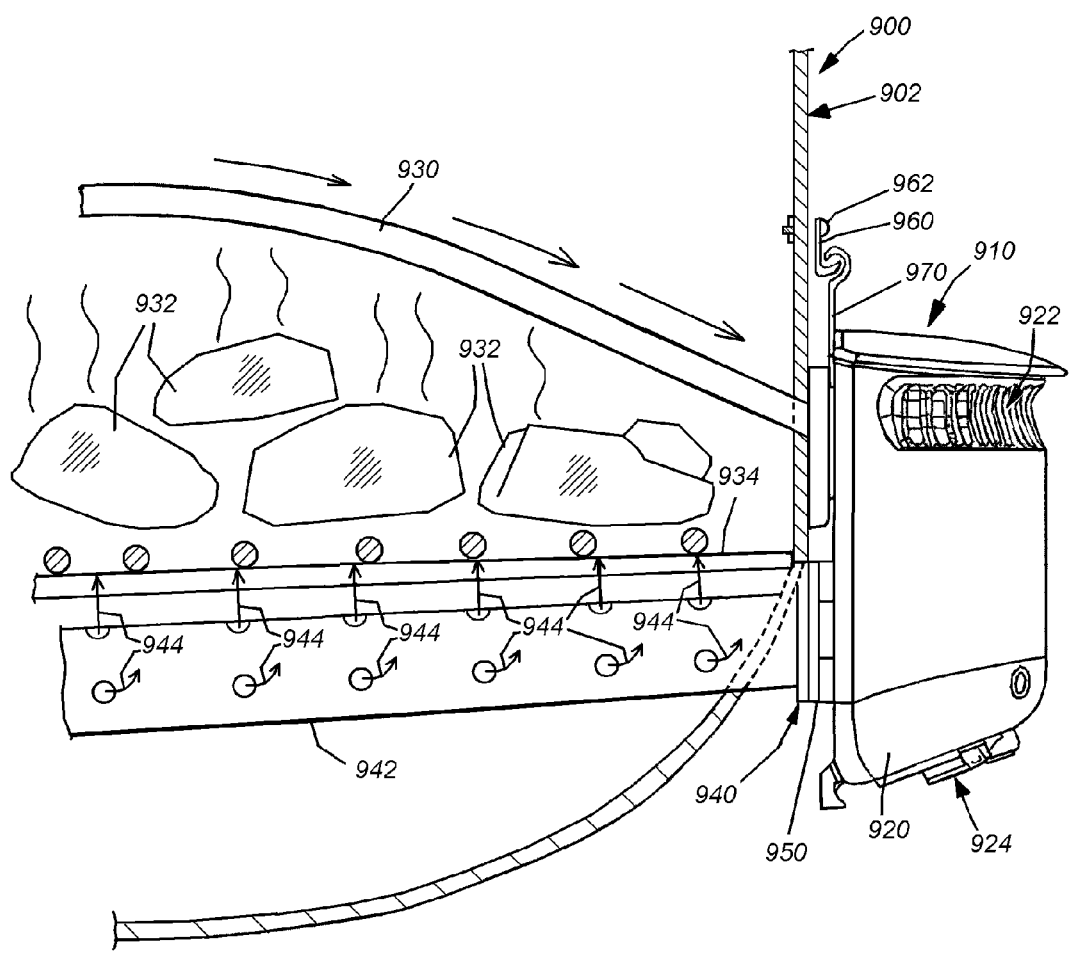
FIG. 9 is a partial side cross section of a universal application of a TEG unit in accordance with an embodiment of this invention, used to improve combustion in an exemplary combustion chamber—in this example a barbeque grille or wood-burning stove.

The principle of the TEG unit as contemplated herein can be applied to a variety of more conventional combustion devices. More generally, the TEG housing 110 described above can be adapted to interoperate with any device having an enclosed combustion chamber, even those with a single wall, provided that the TEG housing (or a modified version thereof) is sufficiently isolated from heat to prevent damage to its external or internal components. Moreover, even burning arrangements that are essentially exposed to the environment, such as a three-stone fire, "rocket" stove, and the like, may benefit from the TEG device of this invention, by increasing airflow onto the burning fuel to increase efficiency and reduce smoke emissions (described below). Thus, FIG. 9 shows a partial side cross section of a combustion device arrangement 900—in this example comprising a substantially conventional single-wall enclosed combustion pot or kettle 902—as the exemplary combustion chamber that can be used in conjunction with a TEG device 910, according to an embodiment of this invention. One example of a combustion device is a charcoal burning stove or barbeque—however any combustion device may benefit by the use of the TEG as described herein. As shown, the TEG device 910 comprises a housing 920 that can be any acceptable shape and size. It includes a vent 922 and lower draft 924 in this embodiment. For the purposes of this example, the housing 920 is similar in shape and size to the housing 110 described above. The internal mechanism, wiring and TEG (not shown), contained within the housing 920, are likewise, similar in size and function to those described above. In alternate embodiments, these components and their arrangement can differ, in part to accommodate the larger scale of the particular combustion chamber 910 shown in FIG. 9.

In this exemplary embodiment, the heat-conducting probe 930 has been extended and shaped to overlie the charcoal fire 932 deposited on a supporting framework 934. The airflow outlet 940 of the TEG device 910. A vented outlet pipe 942 is provided that extends beneath the coals 932 and delivers airflow (arrows 944) at predetermined locations within the chamber 902 so as to further oxidize the burning coals. It should be clear that this is only exemplary of a variety of geometries and placements for an air outlet according to the various embodiments herein. Likewise, vents within a pipe can be provided at a variety of locations that maximize airflow and minimize clogging. In alternate embodiments a more complex outlet assembly can be provided and/or an outlet assembly that overlies the fire can be employed. The outlet can be adapted to the size and shape of the particular combustion arrangement and provide to the end user based upon the particular arrangement. In an illustrative embodiment the outlet assembly/pipe 942 can be removable attached to the housing 920 using clips, screws or other fasteners, or by another locking arrangement (not shown). To ensure that heat is not transmitted to the housing via the pipe 942, an insulating gasket 950, constructed from silicone or another insulating material is provided.

The TEG device 910 in this embodiment can be retrofit to a preexisting kettle 902 or other single-walled enclosure by drilling a hole for each of the probe 930 and the pipe 942 through the wall thereof. A mounting hook 960 is fastened by a fastener 962 to the wall (902) as shown). It engages a hook 970 mounted to the housing 920. This is only exemplary a wide variety of attachment arrangements and combinations of probe and outlet venting that cab be used with various versions of the TEG device in accordance with this invention. Hence, those of ordinary skill should be able to envision a variety of adaptations of the TEG device of this embodiment for use in a variety of original equipment and retrofit combustion devices. In an illustrative embodiment, a large combustion device may be fitted with multiple TEG devices in accordance with the embodiments of this invention. For example, the kettle 902 can be provided with two or more TEG devices 910 positioned about its perimeter. Likewise, where the TEG device is to be used with an open fire (a three-stone fire or barbeque pit, for example, it can be fitted with a removable and/or telescoping stand, hanging hook (or probe hook), leg assembly, or other support mechanisms. Such a TEG device can also include an appropriately shaped and elongated probe and airflow distribution outlet (a nozzle arrangement for example), that best directs heat from and air to the burning fuel mass. For the purposes of such an or field-expedient combustion arrangement, the term "wall" as used in herein to describe a combustion chamber can refer to any barrier, such as an earthen base or stone that contains the fire. This term can in fact refer to notional barrier, where the fire is formed as a pile of fuel with sufficient perimeter clearance to define a concentrated burning area without the fire spreading therebeyond. Moreover, the TEG device can be constructed so as to be remote from the wall and interconnected therewith via elongated probe and airflow outlet assemblies. The term "adjacent" can be used to generally describe the location of the TEG either on or operatively connected, but remote from, the wall.

Figure 10:
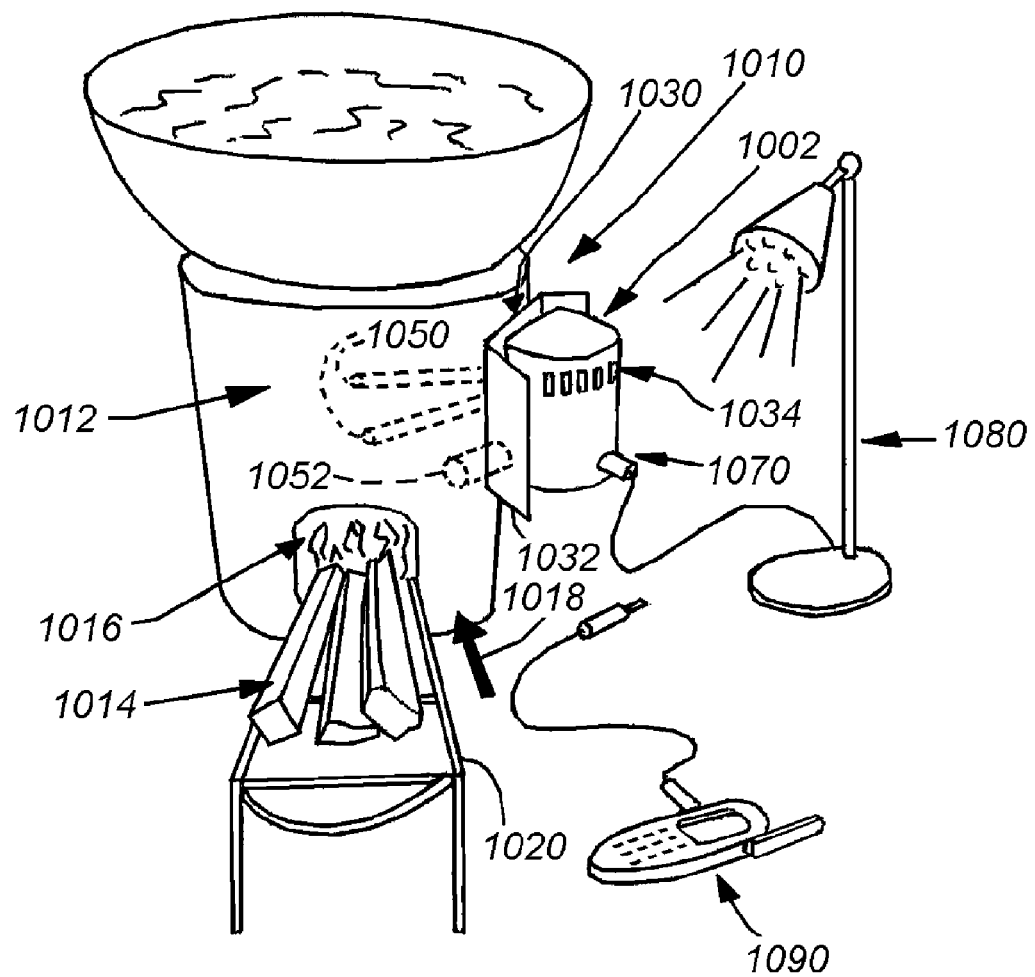
FIG. 10 is a perspective view of an exemplary side-fed "rocket" stove employing a TEG unit in accordance with an embodiment of this invention, in which the TEG unit includes a cogeneration circuit for powering a variety of electronic and/or electrical devices.

FIG. 10 details an embodiment that includes a variety of optional features, which can be applied variously to the embodiments described herein and are detailed in this view by way of further illustration. As depicted, the TEG device 1002, according to an illustrative embodiment, can be mounted on the wall 1012 of a single walled, side-feeding stove 1010, such as the depicted "rocket" stove arrangement. The following description is also applicable to so-called gassifier designs that also allow for introduction of fuel via an elevated side drawer that contains the fuel. The "rocket" design allows for elongated wood fuel 1014 to be manually directed through a side port 1016 that also acts as a vent for air/oxygen. The fuel 1014 is advanced (arrow 1018) into the port 1016 along a crib 1020 as the leading end of the fuel turns combusts to ash. The TEG device 1002 is mounted with respect to a bracket 1030 and/or through-cut that can include a side shield 1032, which prevents adjacent air warmed by the wall 1012 from directly entering the inlet 1034 of the TEG device 1002. This allows the inlet air passing over the TEG heat sink to be cooler, thereby enhancing the efficiency of the device. The stove wall 1012 can include one or more ports (not shown) for accommodating one or more heat-conduction probes 1050 (shown in phantom projecting into the interior) as described generally herein. Note that it is expressly contemplated that two or more probes (1050) can be operatively connected to the TEG and can define differing lengths and/or shapes. One goal of this multiple-probe arrangement can be to more fully cover the overall combustion area or account for variation in flame height. Another goal can be to ensure further heat from the overall combustion region is directed to the TEG. In addition to the probe, the TEG device 1002 in this embodiment includes an air outlet port or pipe 1052 (shown in phantom also directed into the interior) that directs the airflow from the TEG device housing into the stove's interior/burn chamber. The outlet pipe (or multiple pipes/outlets) can be oriented to provide a circulating and/or directional draft to the airflow. As further described below, the TEG device can alternately omit an outlet port in communication with the flame, and can direct only one or more heat-conducting probes to the flame source where the TEG device's mission is primarily energy generation. In such embodiments, the outlet port vents to ambient atmosphere.

Figure 11:
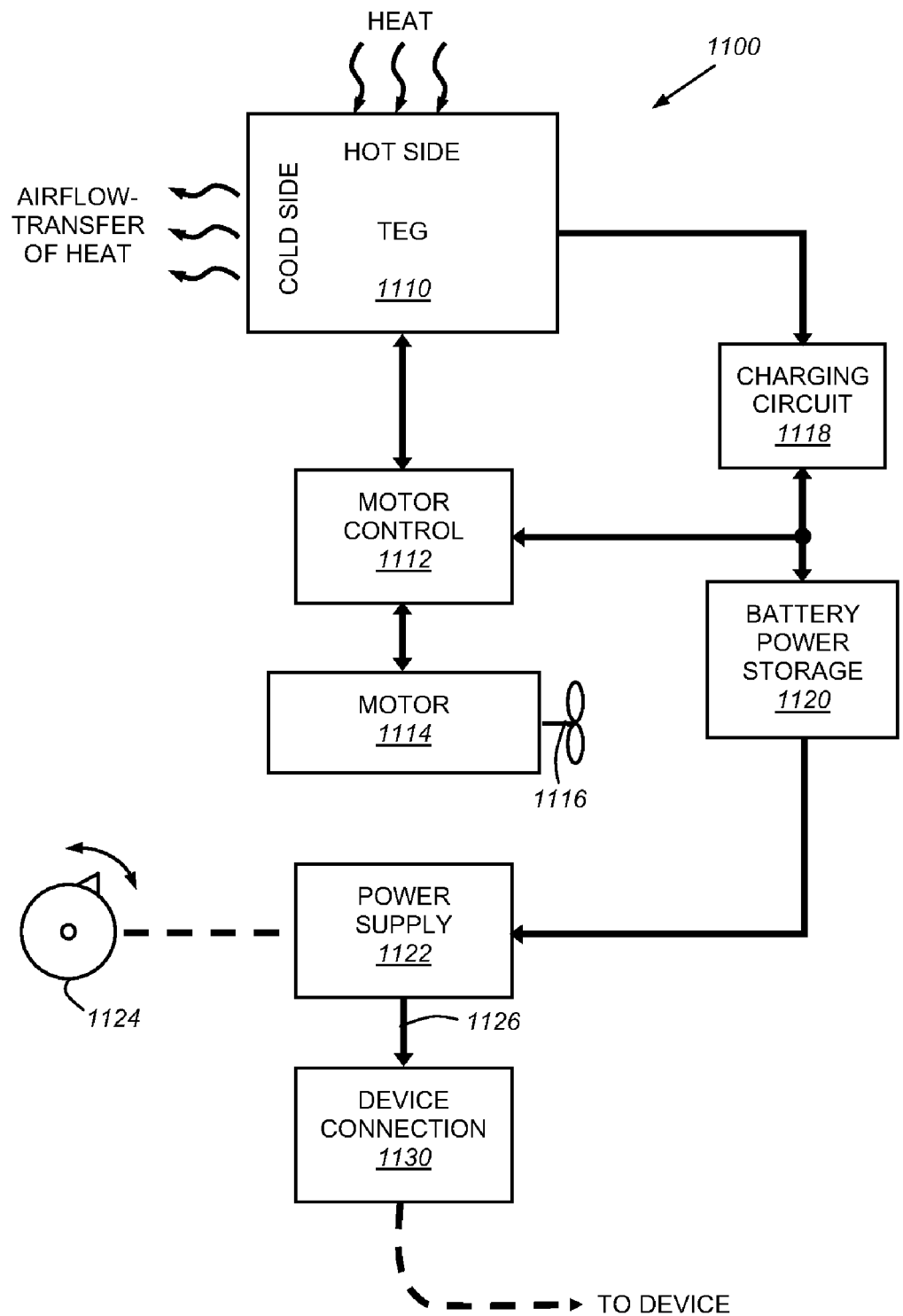
FIG. 11 is a generalized schematic diagram of the TEG unit power circuitry according to an embodiment that includes a cogeneration circuit and power storage capabilities.

With further reference to FIG. 10, the TEG device includes an electrical outlet 1070 that enables interconnection with a variety of electrical devices and/or the rechargeable battery circuits for such devices. Two depicted examples are a light unit (for example a high-intensity solid state (LED) lamp) 1080 and a cellular telephone 1090. A variety of other electronic and/or electrical devices (not shown) can also be interconnected, including, but not limited to battery chargers, rechargeable power tools, laptop computers, PDAs, still and video cameras, navigation devices, radios, video players, signaling devices, and any other appliance that operates or allows charging within the limitations of the TEG device's generation capacity. Clearly, even a high-power-usage device can be supported by the TEG device's power generation capabilities, if it is rechargeable, and tolerates an appropriate (often lowered) charging rate With further reference to FIG. 11, an illustrative circuit arrangement 1100 for the TEG device 1002 according to FIG. 10 is shown in further detail. Some or all of this schematic is also applicable to other embodiments herein, depending upon their respective requirements—for example whether or not the device includes batteries and/or cogeneration capabilities. As shown in FIG. 11, the circuit 1100 includes the above-described TEG 1110 in which the differential between heat on the hot side with respect to the cold side generates power that is directed to a motor control 1112. In a simplified embodiment, the motor control can be omitted in favor of a direct connection to the motor 1114 that drives an airflow-driver (fan assembly) 1116. A plurality of motors and/or interconnected airflow drivers (axial fans, centrifugal fans, etc.) can be employed in alternate embodiments. The TEG 1110 (or another portion of the circuit) is operatively connected to a charging circuit 1118 in this embodiment. The charging circuit 1118 provides charging current at an appropriate voltage level to the storage battery or capacitor 1120 as needed by the battery. The battery 1120 is also connected via the motor control 1112, or directly to the motor 1114 to power it in the absence of sufficient TEG power. The motor control can act as a balancing circuit between TEG and battery power in such instances. The battery, which discharges at a relatively level voltage and current, is connecter to a power supply circuit 1122 (typically of conventional design). The power supply can include an optional potentiometer or digital voltage selector 1124 that allows the output 1126 to vary, so as to meet the specific voltage needs of the connected device. One or more specific device connectors 1130 can be provided. For example, the device connector 1130 can consist of a cable with a conventional two-prong socket that mates to a variety of end connectors tailored to the specific device. Such an arrangement is currently commercially available in universal AD-to-DC converters. Alternatively, the device connector 1130 can define a standard aircraft seat plug fitting and/or automotive cigar lighter socket residing on the device, adapted to connect to a commercially available 12 VDC male adapter that modifies the voltage (and current, where applicable) to meet the specific needs of the device. Such adapters are typically available as an accessory for various devices.

It is contemplated that some or all of the circuit components, including the storage battery/capacitor can be housed within an appropriately shaped and sized TEG device housing. Alternatively, various components of the circuit can be housed separately and interconnected via fixed or detachable cabling and/or connectors. In one embodiment, the storage battery can be provided in a "piggyback" unit (not shown) that removably attached to the main TEG device housing, and thereby completes an electrical connection between respective contact pads.

It should be clear that the above-described embodiments provide a highly versatile device combustion-enhancing and/or energy-generating for both portable and fixed-base applications. The design lends itself to integration in many types of cooking and heating arrangements, using a variety of fuels and techniques for venting air and exhaust gasses. The various embodiments are relatively inexpensive to produce, low- or no-maintenance and easy to use. Such designs are, thus, well suited to camps and bush environments, as well as use in developing countries.

The foregoing has been a detailed description of illustrative embodiments of the invention. Various modifications and additions can be made without departing from the spirit and scope of this invention. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. For example, as used herein to describe the portable combustion device, the term "smoke-free" or "waste-free" is intended to mean that the device operates by burning a fuel while producing very little to no smoke as it burns the fuel. The term "TEG" as used herein should be taken broadly to refer to a variety of equivalent devices that are capable of converting heat form a source into electrical energy in a manner that can be used in accordance with the general arrangement of components described and contemplated in accordance with this invention. The TEG device can comprise an array of devices, each in communication with a portion of the heat source/flame where appropriate. Likewise, while an exemplary size range is provides, this is only an example and this invention contemplates larger or smaller-scale device where appropriate. The combustion device as described herein has been largely cylindrical in shape with a generally circular perimeter, particularly the combustion chamber and heat shield. However, its perimeter may define any cross-sectional shape including square, rectangular, triangular, and the like. The stove or other combustion arrangement can be constructed and arranged to receive initial and/or replacement fuel from any position, including, but not limited to bottom-feed, top-feed and side-feed. Also, while the cross-sectional shape of the probe is generally circular (cylindrical), the cross section can vary. For example, the cross section shape can be rectangular, polygonal, ovular or irregular. More generally, any structure that acts as a heat-transfer conduit from the heat source/flame to the TEG can be considered a "probe" in accordance with this invention. Likewise, the cross section shape and/or size can vary along the length of the probe (e.g. a taper). Additionally, while the airflow driver in the depicted embodiments is generally a fan, such as an impeller, the energy can be used to store air pressure (using a compressor and storage tank), for release at appropriate times (and in appropriate volume) via a valve and conduit. Alternatively, the airflow driver can comprise a compressor or suction pump that draws air at a desired rate. As device that generates desired airflow can be considered an airflow driver for the purposes of this description. Furthermore, while the standoff (108) of the illustrative combustion device is depicted as comprising a plurality of metal segments welded together to form a surface for receiving an item such as a skillet or other device for heating food or any other substance desired to be heated, any appropriate supporting structure may be employed for placing an item atop the combustion chamber so that it may be heated, such as a skillet for cooking food. Accordingly, this description is meant to be taken only by way of example, and not to otherwise limit the scope of this invention.

What is claimed is:

1. A combustion device comprising:
   a combustion chamber comprising an inner wall defining a combustion space that contains, and is in communication with, a biomass fuel source and an outer wall having a side-mounted interface port allowing access of airflow into the combustion space enclosed within the outer wall;
   a thermoelectric generator (TEG) located outside the outer wall and including at least one thermally connected heat-conducting probe on a hot side thereof that extends into the combustion space, the TEG further including a heat sink thermally connected to a cold side thereof; and
   a motorized airflow driver electrically connected to the TEG and constructed and arranged to drive air from an ambient source, over the heat sink and into the interface port so as to generate a positive pressure in the combustion space;
   wherein the TEG is provided in a TEG housing having a vent thereon upstream from and confronting the heat sink and an airflow interface remote and downstream from the motorized airflow driver, the airflow interface being constructed and arranged to engage the interface port on the outer wall.

2. The combustion device as set forth in claim 1 further comprising an inner wall surrounding the combustion chamber and surrounded by the outer wall, the inner wall defining an airspace with respect to the outer wall, the inner wall including a port structure that provides access for passage of the airflow from the interface port to the combustion chamber.

3. The combustion device a set forth in claim 2 wherein the port structure defines a plurality of ports located about at least a portion of a perimeter of the inner wall adjacent to at least one of an upper end and a lower end of the combustion space.

4. The combustion device as set forth in claim 1 further comprising a plurality of folding legs, and wherein the heat-conducting probe is located at an acute angle with respect to a horizontal plane defining a supporting surface for the legs, at least one of the legs constructed and arranged to move between an engaged and a disengaged orientation with respect to the TEG housing so as to selectively enable engagement and disengagement, respectively, of the TEG housing from the outer wall.

5. The combustion device as set forth in claim 1 wherein the TEG housing is constructed and arranged to be stored within the combustion space.

6. The combustion device as set forth in claim 1 wherein the TEG housing includes a draft located adjacent to the airflow interface so as to provide ambient air to the TEG housing at a location remote from the vent.

7. The combustion device as set forth in claim 6 wherein the draft is adjustable to vary airflow passing therethrough.

8. The combustion device as set forth in claim 1 further comprising a heat shield that extends around at least a portion of the outer wall.

9. The combustion device as set forth in claim 2 wherein the inner wall and the outer wall each define a pot shape with an enclosed bottom and wherein an upper edge of the outer wall is sealed against an outer edge of the inner wall to seal the airspace.

10. The combustion device as set forth in claim 9 wherein the upper edge of the outer wall engages a standoff with slots so as to allow air to pass therethrough when a cooking surface is rested upon the standoff.

11. The combustion chamber as set forth in claim 1 wherein the combustion space is constructed and arranged to receive fuel through at least one of a side port and a top opening.

12. The combustion space as set forth in claim 1 further comprising an energy storage circuit operatively connected to the TEG so as to store energy generated by the TEG.

13. The combustion device as set forth in claim 12 wherein the energy storage circuit is operatively connected to a connector constructed and arranged to electrically connect an electronic or electrical device.

* * * * *